United States Patent
Rowhani

(10) Patent No.: US 8,269,525 B2
(45) Date of Patent: Sep. 18, 2012

(54) LOGIC CELL HAVING REDUCED SPURIOUS TOGGLING

(75) Inventor: Omid Rowhani, Newmarket (CA)

(73) Assignee: ATI Technologies ULC, Markham, Ontario (CA)

( * ) Notice: Subject to any disclaimer, the term of this patent is extended or adjusted under 35 U.S.C. 154(b) by 0 days.

(21) Appl. No.: 12/620,042

(22) Filed: Nov. 17, 2009

(65) Prior Publication Data

US 2011/0115524 A1    May 19, 2011

(51) Int. Cl.
*H03K 19/00*    (2006.01)

(52) U.S. Cl. .............. 326/93; 326/96; 326/98; 326/113; 327/202; 327/291

(58) Field of Classification Search .............. 326/56–58, 326/93, 95–98, 112–113; 327/202, 291
See application file for complete search history.

(56) References Cited

U.S. PATENT DOCUMENTS

| | | | |
|---|---|---|---|
| 4,495,629 A * | 1/1985 | Zasio et al. ...................... 377/70 |
| 5,544,101 A | 8/1996 | Houston |
| 5,675,808 A | 10/1997 | Gulick et al. |
| 5,781,768 A | 7/1998 | Jones, Jr. |
| 6,057,709 A * | 5/2000 | Hesley ............................ 326/54 |
| 6,256,743 B1 | 7/2001 | Lin |
| 6,263,448 B1 | 7/2001 | Tsern et al. |
| 6,292,931 B1 * | 9/2001 | Dupenloup .................... 716/104 |
| 6,297,683 B1 | 10/2001 | Drapkin et al. |
| 6,307,281 B1 | 10/2001 | Houston |
| 6,848,058 B1 | 1/2005 | Sinclair et al. |
| 6,971,034 B2 | 11/2005 | Samson et al. |
| 7,047,339 B2 | 5/2006 | Oakley |
| 7,149,909 B2 | 12/2006 | Cui et al. |
| 7,343,508 B2 | 3/2008 | Khodorkovsky |
| 7,411,413 B2 * | 8/2008 | Shimazaki et al. ............. 326/16 |
| 2002/0140481 A1 * | 10/2002 | Tschanz et al. ................ 327/218 |
| 2004/0075479 A1 * | 4/2004 | Gupta ............................ 327/202 |
| 2006/0026450 A1 | 2/2006 | Bounitch |
| 2006/0187226 A1 | 8/2006 | Bruno et al. |
| 2006/0256102 A1 | 11/2006 | Swan |
| 2007/0008024 A1 * | 1/2007 | Cheng ............................ 327/291 |
| 2008/0115025 A1 * | 5/2008 | Frederick ...................... 714/732 |
| 2008/0258789 A1 * | 10/2008 | Motomura ..................... 327/202 |
| 2009/0066386 A1 * | 3/2009 | Lee ................................ 327/202 |
| 2010/0083062 A1 * | 4/2010 | Huang et al. .................. 714/718 |

OTHER PUBLICATIONS

Rhyne: Fundamentals of Digital Systems Design (N.J. 1973 pp. 70-71).*

* cited by examiner

*Primary Examiner* — Jason M Crawford

(74) *Attorney, Agent, or Firm* — Faegre Baker Daniels LLP

(57) ABSTRACT

A disclosed integrated circuit logic cell includes a clock input operative to receive a clock input from a clock tree of the integrated circuit, and clocking circuitry, internal to the logic cell, operative to place a plurality of clock nodes, within the logic cell, in a logical off state in response to a predetermined logic state of the logic cell, thereby preventing the clock nodes from toggling during the predetermined logic state of the logic cell. The integrated circuit logic cell includes primary logic circuitry, internal to the logic cell, operatively coupled to the clocking circuitry which is operatively coupled to an input of the primary logic circuitry. The clocking circuitry provides clock outputs operatively coupled to the clock nodes which are within the primary logic circuitry, and is operative to control the clock outputs in response to the predetermined logic state.

23 Claims, 6 Drawing Sheets

LOGIC CELL HAVING REDUCED SPURIOUS TOGGLING

FIELD OF THE DISCLOSURE

The present disclosure is related to logic circuits having a clock input.

BACKGROUND

Integrated circuits consist of multiple logic circuit elements that each have a power consumption requirement. These logic circuit elements are normally formed on the integrated circuit by an integrated circuit (IC) fabrication system that uses software code and/or data that provides representations of the logic circuit elements which the IC fabrication system may use to position and provide given logic circuit elements at the appropriate point on the IC based on a design. Such logic circuit elements are referred to as "cells," "logic cells" or "standard cells," and are used as basic building blocks of an overall IC architecture. An example software code, having executable instructions, used to create such logic cells is the hardware description language (HDL). Also "netlist" languages may be used to specify logic cells and corresponding circuit connectivity on computer-aided design (CAD) systems. In any case, logic cells are small building blocks (i.e. up to about 30 to 40 transistors) that are usually stored in libraries that may be drawn upon to create circuit designs on an IC.

Various techniques and approaches exist for reducing power consumption on integrated circuits. For example, portions of the clock tree within the IC may be gated or switched off by control modules that monitor activity of "logical areas" on the IC, that is, areas that perform a given logical function.

Many logic circuits such as flip-flops and latches employ an individual clock input, that is obtained from the IC clock tree, that switch various states of the logic circuit when an appropriate input is received, such as "set," "reset," etc. There are periods of time however, when a logic circuit may remain in a given logic state, such as, for example, a set mode or a reset mode, where the clock signal is not specifically needed. In existing designs, spurious toggling may occur at various internal nodes of the logic circuit that receive inputs from the clock, and also other nodes that are not directly controlled by the clock, when the logic circuit is in such a given mode such as set or reset mode. Such toggling needlessly consumes power and serves no useful purpose within the integrated circuit. In other words, even in an IC that utilizes known power consumption reduction techniques, such as switching portions of the clocking tree on and off in logical areas that have no activity, the individual logic circuits formed by cells will still continue to waste power during activity of logical areas due to needless toggling.

FIG. 1 illustrates known logic cell 150, (also known as a "standard cell" or as a "cell"), of an integrated circuit (IC). The logic cell 150 includes logic circuitry 100 which may be, for example, a latch logic circuitry. The logic circuitry includes a set 101 input, a data ("D") 103 input, and receives a clock input from the IC clock tree, CLK 111. The logic cell 150 includes a clocking circuitry portion that divides the CLK 111 into a internal clock signal "c" 107, and an internal negated clock input labeled "cn." The c 107 and cn 109 inputs are provided to various nodes within the logic circuitry portion 100 of the logic cell 150.

FIG. 2 illustrates a more detailed example of a known logic cell 200. Logic cell 200 includes a latch logic circuitry portion that is exemplary of the known logic circuitry portion 100.

The latch logic circuitry portion of the logic cell 200 includes a clocked inverter 201 which provides an inverted D 103 input to NAND gate 203. The NAND gate 203 provides output to inverters 205 and 207, with inverter 207 providing the latch output "Q" 105. The NAND gate 203 also provides a feedback output to clocked inverter 209, which receives the negated clock cn 109. The prior clocking circuitry portion 113 of the logic cell 200 consists of two inverters 115 and 117. The internal negated clock signal cn 109 is taken from the first inverter 115 and the internal regular clock signal c 107 is taken from the second inverter 117. When the logic cell 200 is in a given logic state, such as a set mode, the nodes formed by clocked inverters 201 and 209 will continue to receive their respective clock signals which results in unnecessary power consumption.

In FIG. 2, when set 101=0, the output Q 105=1. However, all clock nodes toggle while the latch logic circuitry portion of the logic cell 200 remains in the set mode. Further, the node "qf_x" may continuously toggle in the set mode whenever D is in a low condition. Also, four logic gates are required on the path from D 103 to Q 105, that is, clocked inverter 201, NAND gate 203, inverter 205 and inverter 207. The area on the integrated circuit to implement the known logic cell 200 requires 20 transistors such as 20 field effect transistors (FETs).

FIG. 3 illustrates another example logic cell 300 that exhibits similar problems with respect to undesirable toggling. A flip-flop logic circuitry portion of the logic cell 300 uses the same configuration of clocking circuitry portion as discussed with respect to FIG. 2. A negated clocked (cn) inverter 301 provides input to NAND gate 303 which in turn provides output to a clocked transmission gate 311. The transmission gate 311 provides output to inverter 305 which in turn feeds inverter 307 which provides output Q 105. NAND gate 315 receives set 101 input and a second input from inverter 305, and feeds negated clocked transmission gate 313, which in turns provides feedback to inverter 305. The NAND gate 303 receives the set 101 input and its output provides a feedback input loop back to itself from clocked inverter 309. The clock nodes of the flip-flop portion of logic cell 300 also toggle undesirably, thereby consuming power needlessly.

DETAILED DESCRIPTION

Figure 1:
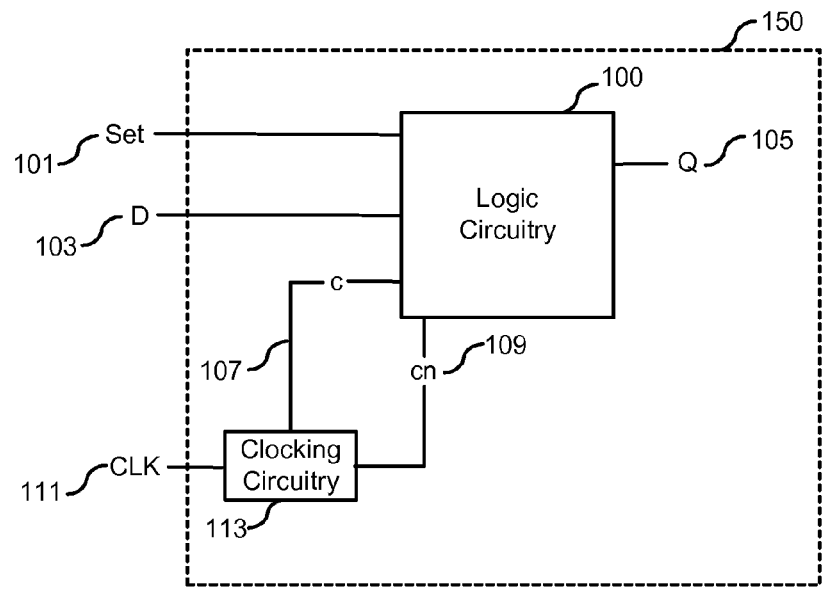
FIG. 1 is a schematic logic diagram of a prior known logic cell that has logic circuitry and clocking circuitry wherein clocking nodes of the logic circuitry toggle in an undesirable manner.

The present disclosure provides an integrated circuit logic cell that has a clock input operative to receive a clock input from a clock tree of the integrated circuit, and clocking circuitry, internal to the logic cell, operative to place a plurality of clock nodes, within the logic cell, in a logical off state in response to a predetermined logic state of the logic cell, thereby preventing the clock nodes from toggling during the predetermined logic state of the logic cell.

The integrated circuit logic cell may include primary logic circuitry, internal to the logic cell, operatively coupled to the clocking circuitry. The clocking circuitry is operatively coupled to an input of the primary logic circuitry, and provides clock outputs operatively coupled to the internal clock nodes of the logic cell. The clocking circuitry is operative to control the clock outputs in response to the predetermined logic state. The clocking circuitry may be operative to control the clock outputs in response to a predetermined input state of the input of the primary logic circuitry.

In some embodiments, the clocking circuitry includes a NAND gate having a first input operative to be coupled to a clock tree of the integrated circuit, and has a second input operatively coupled to the input of the primary logic circuitry, and an inverter operatively coupled to an output of the NAND gate.

In one embodiment, the integrated circuit logic cell primary logic circuitry is an active high, asynchronous set latch logic circuitry. In another embodiment, the integrated circuit logic cell primary logic circuitry is an asynchronous set flip-flop logic circuitry. In another embodiment, the integrated circuit logic cell primary logic circuitry is an active high, asynchronous reset latch logic circuitry. In another embodiment, the integrated circuit logic cell primary logic circuitry is an active low, asynchronous set latch logic circuitry. In another embodiment, the integrated circuit logic cell primary logic circuitry is an active low, asynchronous reset latch logic circuitry.

One embodiment is an integrated circuit that includes at least one integrated circuit logic cell in accordance with the various embodiments herein described.

The embodiments also include a method of operation in an integrated circuit logic cell, which includes monitoring, by clocking logic of the integrated circuit logic cell, a logic state of the integrated circuit logic cell, and turning off, by the clocking logic, clocked nodes within the integrated circuit logic cell in response to the logic cell entering a predetermined logic state. The method may also include monitoring, by the clocking logic, a logic state of the integrated circuit logic cell, by monitoring a logic state of an input of the logic cell.

The present disclosure further provides a computer readable memory having executable instructions for execution by an integrated circuit production system, that when executed cause the integrated circuit production system to produce an integrated circuit that has at least one integrated circuit logic cell in accordance with the embodiments, such as a logic cell having a clock input operative to receive a clock input from a clock tree of the integrated circuit, and clocking circuitry, internal to the logic cell, operative to place a plurality of clock nodes, within the logic cell, in a logical off state in response to a predetermined logic state of the logic cell, thereby preventing the clock nodes from toggling during the predetermined logic state of the logic cell.

The computer readable memory may further include instructions such that the at least one logic cell further includes primary logic circuitry, internal to the logic cell, operatively coupled to the clocking circuitry, wherein the clocking circuitry is operatively coupled to an input of the primary logic circuitry, and wherein the clocking circuitry provides clock outputs operatively coupled to the clock nodes wherein the clock nodes are within the primary logic circuitry, wherein the clocking circuitry is operative to control the clock outputs in response to the predetermined logic state.

The computer readable memory may further include instructions such that the at least one logic cell further includes clocking circuitry that is operative to control the clock outputs in response to a predetermined input state of the input of the primary logic circuitry. The computer readable memory executable instructions may be in a hardware description language (HDL) or RTL format.

The term "logic" as used herein may include software and/or firmware executing on one or more programmable processors, ASICs, FPGAs, DSPs, hardwired logic or combinations thereof. Therefore, in accordance with the embodiments, various logic may be implemented in any appropriate fashion and would remain in accordance with the embodiments herein disclosed.

The terminology "integrated circuit logic cell" or "logic cell" as used herein, which are also referred to as "cells," or "standard cells," are basic building blocks of an overall IC architecture. That is, "logic cells" as used herein are small building blocks (i.e. up to about 30 to 40 transistors, more or less) that are usually stored in libraries that may be drawn upon to create circuit designs on an IC. An example software code, having executable instructions, used to create such logic cells is the hardware description language (HDL) which may be used to fabricate integrated circuits by using a plurality of logic cells which may be contained in a library of standard cells that may be drawn from for design and fabrication. Also "netlist" languages may be used to specify logic cells and corresponding circuit connectivity on computer-aided design (CAD) systems. In one example, a logic cell may include 20 transistors, while in a second example a logic cell may include 40 transistors. In yet another example, a logic cell may include 45 transistors or more. The "logic cell" may be part of a library (also referred to as a "standard cell library") of logic cells that are used as building blocks for IC design and fabrication. The various advantages of the embodiments herein described are obtained by having logic circuitry at a low level of granularity within the IC (i.e. logic circuitry within the logic cell level) such that the logic cell independently reduces its power consumption, independently and without a centralized control and/or monitoring mechanism. Therefore, a logic cell is a building block level of granularity on an IC, where the building block is used to construct a larger functional circuitry on an IC.

The terminology "circuitry" and "circuit," (such as "logic circuitry" or "logic circuit"), refers generally to hardwired logic such as, but not limited to, latches, flip-flops, registers, etc., that may be implemented using various logic gates which may further include various discrete components such as, but not limited to, diodes, bipolar junction transistors (BJTs), field effect transistors (FETs), etc., which may be implemented on an integrated circuit using any of various technologies as appropriate, such as, but not limited to CMOS, NMOS, etc. Therefore, a "logic cell" may contain various circuitry or circuits.

The term "node" as used herein indicates a connection point within the logic circuitry and may be a connection point between discrete components, an input connection point, an output connection point, etc. Thus, for example, the primary logic circuitry described herein includes a plurality of clock nodes, that is, a plurality of connection points where the clocking circuitry clock outputs are connected. The node may be more than a connection and may include a discrete component that receives the clock signal input and changes states in response to the clock input signal. Therefore the "node" may include one or more discrete components.

A "predetermined logic state" as used herein is a condition of logic circuitry such as, but not limited to, a latch, flip flop, register, etc., wherein the condition may be such as, but not limited to, a "set" condition, a "reset" condition, etc. Such predetermined logic states, may be the result of a predetermined input which results in a predetermined output. For example, a latch may have a "set" logical state which is obtained by presenting a given binary value, for example binary 1, at an input node, i.e. at the "set" input node of the latch, which in turn results in a corresponding output "Q" of a given binary value, at an output node "Q" of the latch. The logical 1 or logical 0 corresponds to a voltage value (or a current value) presented at an input, or obtained as an output, depending on the technology and the design as understood by those of ordinary skill. That is, various voltage values may be interpreted as a logical 1 or logical 0.

It is to be understood that the terms "on" and "off" are relative to logical values such as logical value "1" or logical value "0," which may also be represented as binary "1" or binary "0." The values 1 and 0 are binary values (or logical values) that are normally associated with a logical on and logical off as understood by those of ordinary skill.

In addition to the components shown in the figures which for the purpose of explaining the principles of the various embodiments herein disclosed, other elements such as additional logic gates, and/or discrete components, etc., may be present in the various specific implementations as may be understood by those of ordinary skill, and such other implementations still remain in accordance with the embodiments herein disclosed.

The various logic circuitry disclosed herein may be described in a form useable by a circuit fabrication system. For example, the various logic circuitry disclosed herein may be described in Hardware Description Language (HDL) and may be stored on a computer readable medium/memory. The computer readable medium/memory may be a computer readable memory and may be any suitable non-volatile memory such as, but not limited to, programmable chips such as EEPROMS, flash ROM (thumb drives), compact discs (CDs) digital video disks (DVDs), etc., (that may be used to load HDL and/or RTL, and/or executable instructions or program code), or any other suitable medium so that the HDL, or other suitable data, may be used by various integrated circuit fabrication systems. Therefore, the embodiments herein disclosed include a computer readable medium/memory comprising executable instructions for execution by an integrated circuit production system, that when executed cause the system to produce an integrated circuit comprising at least one integrated circuit logic cell in accordance with the embodiments herein described. The executable instructions may be HDL and/or RTL or any other suitable code and may include code to produce all of the features of the embodiments described above, and also described in further detail herein below.

Figure 4:
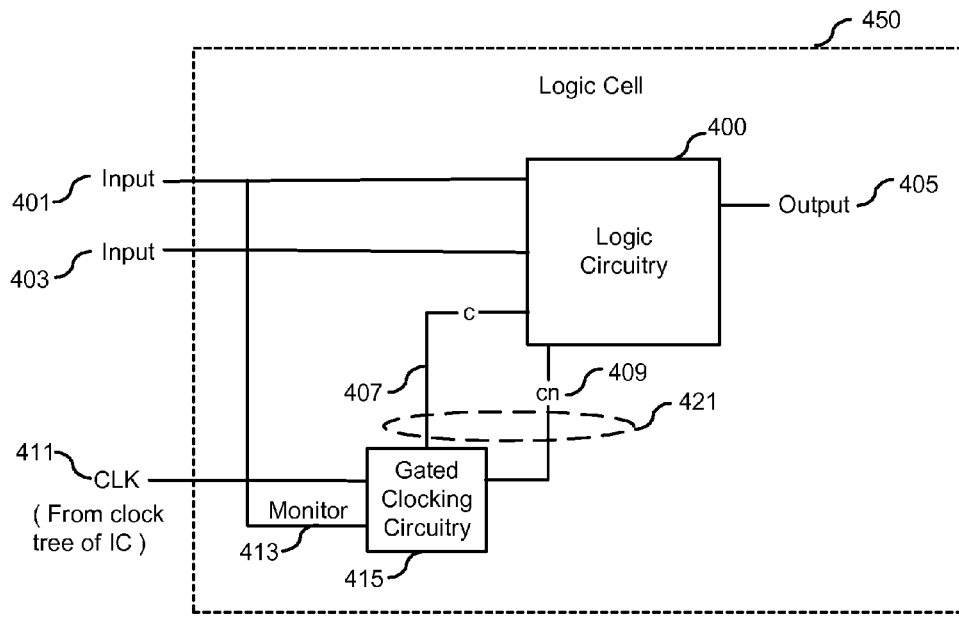
FIG. 4 is a schematic logic diagram of a logic cell which includes logic circuitry and gated clock circuitry in accordance with the various embodiments.

Turning now to the drawings wherein like numerals represent like components, FIG. 4 is a schematic logic diagram of an integrated circuit logic cell 450 in accordance with the various embodiments. The integrated circuit logic cell 450 includes logic circuitry 400 and clock circuitry 415 in accordance with the various embodiments. It is to be understood that FIG. 4, as well as the other figures provided herein, are for the purpose of describing to those of ordinary skill how to make and use logic and/or logic circuitry in accordance with the embodiments, and that therefore, various other arrangements of internal components and corresponding connectivity, that are alternatives to what is shown in the figures, may be utilized and such arrangements of internal components and corresponding connectivity would remain in accordance with the embodiments herein disclosed. In one specific example of such an alternative, a NAND gate may be formed by an OR gate having two inverters at the OR gate inputs. Other such exemplary alternatives may occur to those of ordinary skill and such alternatives provide equivalent implementations that would remain in accordance with the embodiments described herein.

In FIG. 4, the logic cell 450 is shown having a logic circuitry 400 and a clocking circuitry 415, however, in the actual implementation of the logic cell 450 the various components of the logic circuitry 400 and clocking circuitry 415 are integral and may be physically arranged so that it would be difficult to provide any demarcation between the two circuitry elements. However, for purposes of explanation, the logic circuitry 400 is schematically illustrated as separate from the clocking circuitry 415. Both the logic circuitry 400 and the clocking circuitry 415 are integral to the logic cell 450 and may be arranged in any suitable manner according to the specific integrated circuit logic cell physical design which may follow design constraints appropriate for a utilized IC technology.

The logic cell 450 therefore includes a primary logic circuitry 400 which corresponds to the overall functionality of the logic cell 450. For example, the primary logic circuitry 400 may be a latch or flip-flop. The primary logic cell 400 will include at least a first input 401, a second input 403, and provide an output 405. These inputs and outputs correspond to, and are, the inputs and outputs of the logic cell 450 with respect to the logic cell's 450 place in an IC architecture. The logic cell 450 also receives a CLK 411 which is derived from the clock tree of the IC. The primary logic circuitry 400 receives both a clock signal "c" 407, and a negated clock signal "cn" 409, which are internal clock signals that are internal to the logic cell 450, from gated clocking circuitry 415. Gated clocking circuitry 415 receives the primary clock signal, CLK 411, which as discussed above may be obtained from the clock tree of an integrated circuit.

In accordance with the embodiments, the clocking circuitry 415 includes a monitor input 413 that is operatively coupled to one of the primary logic circuitry 400 inputs, such as input 401 as shown. The input 401 may be, for example, a set, or reset, signal, which depends on the specific logic functionality for which logic circuitry 400 is configured. In accordance with the embodiments, logic circuitry 400 will have no unnecessary toggling clock nodes during set or reset modes. By providing a monitor input 413 to gated clocking circuitry 415, and modifying logic circuitry 400 appropriately as will be described using exemplary embodiments, various advantages may be obtained in addition to the elimination of unnecessary power consumption due to the unnecessary toggling of clock nodes within the logic cell 450.

The monitor input 413 may be a set or reset or any other appropriate input to the primary logic circuitry. In other words, the monitor input 413 may be considered to be a predetermined input of the logic circuitry 400 such that the resulting output 405 is also a predetermined value. Thus, a "set" or "reset" input may be used as the monitor 413 and may be considered to monitor for a "predetermined input" such as, but not limited to, a set or reset, etc. Further therefore, the clocking circuitry 415 monitors the logical state or logical condition of the logic cell 450 and may accomplish this by monitoring for a predetermined logic state of one of the logic cell inputs.

In accordance with the embodiments, the clocking circuitry 415 monitors a predetermined logical state of the logic cell, which may be accomplished by monitoring a predetermined logic state of an input, and in response to an appropriate logic cell logic state, or an appropriate predetermined logic state at the logic cell input (that is, a predetermined input condition) as determined by monitor 413, provides a blocking or blocks clock signals at internal nodes of the logic circuitry. For example, the predetermined input condition may be a set input, where set equals logical zero, whereby the clocking circuitry, in response to the predetermined input condition, blocks the internal clock signals 421, including c 407 and cn 409, and provide a c=0 signal to the primary logic circuitry 400. In other words, the clock "c" is in an off condition at internal nodes of the logic circuitry 400 when the clocking circuitry 415 blocks the clock signal. Therefore, in accordance with the embodiments, and as herein described, when the clocking circuitry 415 provides a clock off condition to the primary logic circuitry 400, this is representative of a clock off condition such that the various nodes, which may include various discrete components, logic gate components, etc., are not clocked and therefore, will not exhibit undesirable spurious toggling conditions. In other words, an individual logic cell of the embodiments has a logic cell level activity detection that prevents, at the granular level of a logic cell within an IC, needless power consumption within the individual logic cell 450.

It is to be understood that the embodiments may be used with various other techniques for reducing power consumption on an IC, such as, but not limited to, monitoring activity levels within logical areas of the IC and gating or switching off the clock tree to inactive logical areas as appropriate. With the embodiments herein disclosed, such ICs obtain an additional reduced power consumption because each individual logic cell within the IC architecture will control and reduce its own individual power consumption due to unneeded clock node toggling, even when the logic cell's IC logical area is fully clocked such as when the IC logical area is in an active state. It is to be understood that the advantages of the embodiments are obtained at the level of each logic cell independently without the need for a centralized monitoring and control mechanism as are used for controlling power consumption by logical areas of the IC.

Figure 2:
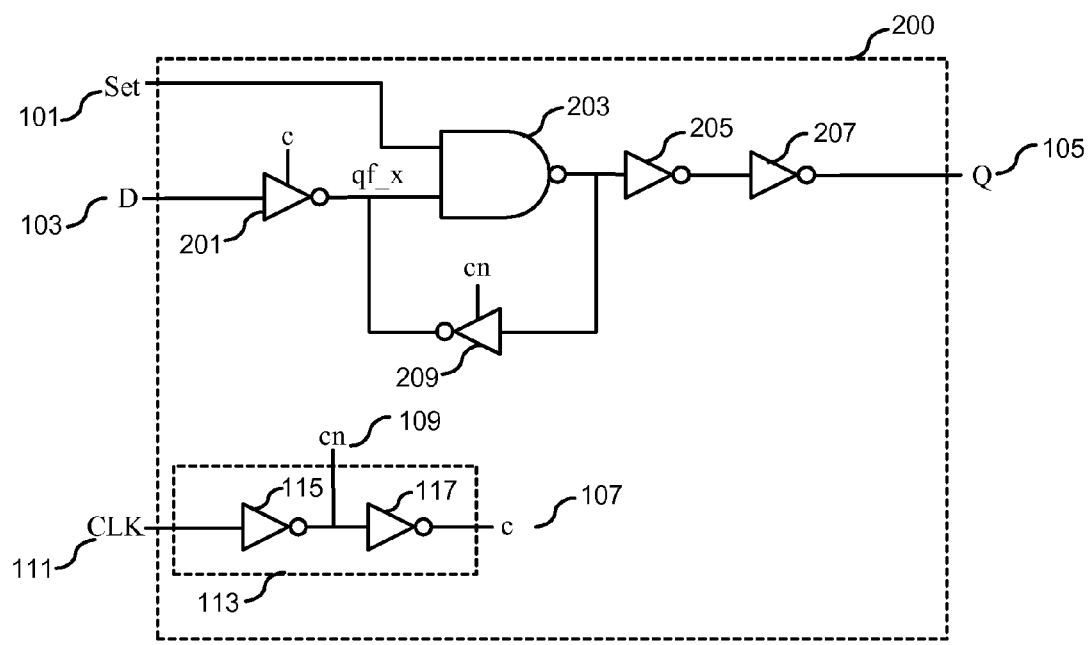
FIG. 2 is a schematic logic diagram of an exemplary prior known logic cell that includes asynchronous set latch logic circuitry, that is active HI, and clocking circuitry wherein clocking nodes of the asynchronous set latch logic circuitry toggle in an undesirable manner.
Figure 5:
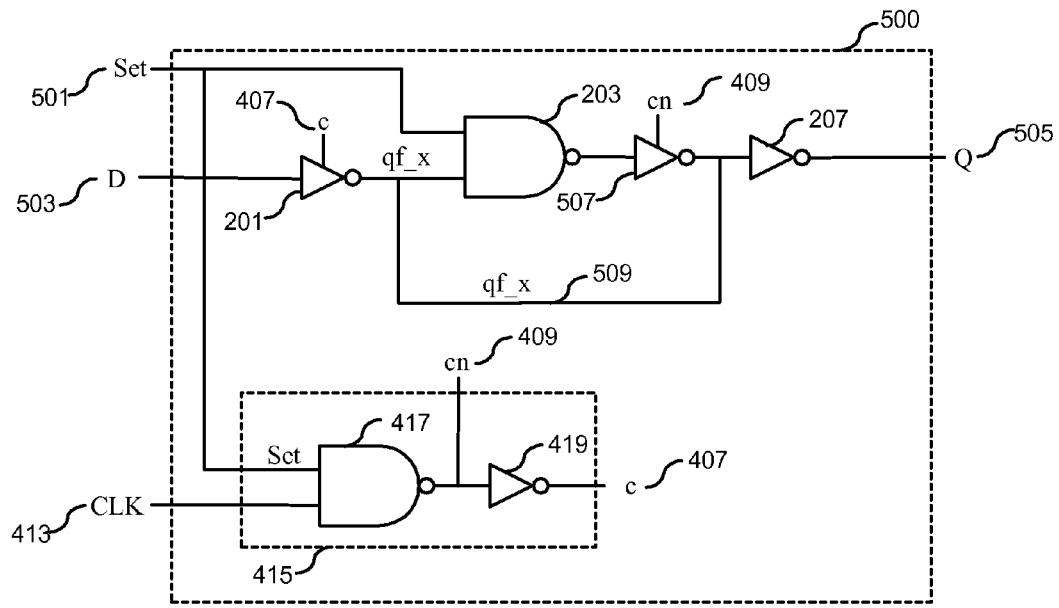
FIG. 5 is a schematic logic diagram of a logic cell in accordance with an embodiment that includes asynchronous set latch logic circuitry, active HI, and gated clock circuitry.

An exemplary embodiment of a logic cell, in accordance with one embodiment, is provided in FIG. 5 which is a schematic logic diagram of a logic cell 500 with an asynchronous set latch logic circuitry, having active high inputs ("active HI," that is, being active during the high portion of the clock pulse), and gated clock circuitry in accordance with an embodiment. FIG. 5 may be viewed as modifying the known latch circuit that was described in FIG. 2. Comparison of modified latch circuitry with the known latch circuit shown if FIG. 2 shows that the negated clocked inverter 209 shown in FIG. 2 has been eliminated and replaced by a feedback line 509, which provides feedback from the output of negated clocked inverter 409, to the input of NAND gate 203. The inverter 205 in the latch of logic cell 200 has been replaced by the negated clocked inverter 409 in the latch of logic cell 500. Also to be noted in FIG. 5, is that the gated clocking circuitry 415 receives the set 501 input along with the primary clock, CLK 413, and these inputs drive a NAND gate 417 to produce cn 409. An inverter 419 provides the output c 407.

In operation, when set 501 equals logical zero, the CLK 413 is gated, via NAND gate 417, such that cn equals logical one (i.e. cn=1) and c=0 (i.e the output of inverter 419 is logical zero). In this condition, the latch circuitry (the primary logic circuitry of the logic cell 500) is blocked, that is, the latch circuitry is in a non-transparent mode, and the feed back loop 509 ("qf_x") is closed. As a result, the output Q 505 equal logical "1."

Among other advantages of the logic cell 500 example embodiment, the internal clock tree to nodes within the primary logic circuitry (latch circuitry) of logic cell 500 stops toggling when set=0 and therefore active power consumption is reduced. Further, the qf_x node formed by feedback line 509 remains in a logical low state and will not toggle while the latch circuitry is in the set mode since the input tri-state is blocked. (That is, the clocked inverter 201 may be considered a tri-state logic gate that is blocked when c=0). Therefore, a further reduction in active power consumption is obtained.

Another advantage of the logic cell 500 example embodiment is that no additional integrated circuit chip real estate is required to implement the embodiment. That is, the logic cell 500 can be implemented in an area of twenty transistors, such as 20 FETs. Yet another advantage is that the Q-delay is reduced since the D 503 to Q 505 path is only through clocked inverter 201 and inverter 207. In contrast, the D 103 to Q 105 path of the latch circuit shown in FIG. 2 is four logic gates long, that is, clocked inverter 201, NAND gate 203, inverter 205 and inverter 207.

Figure 3:
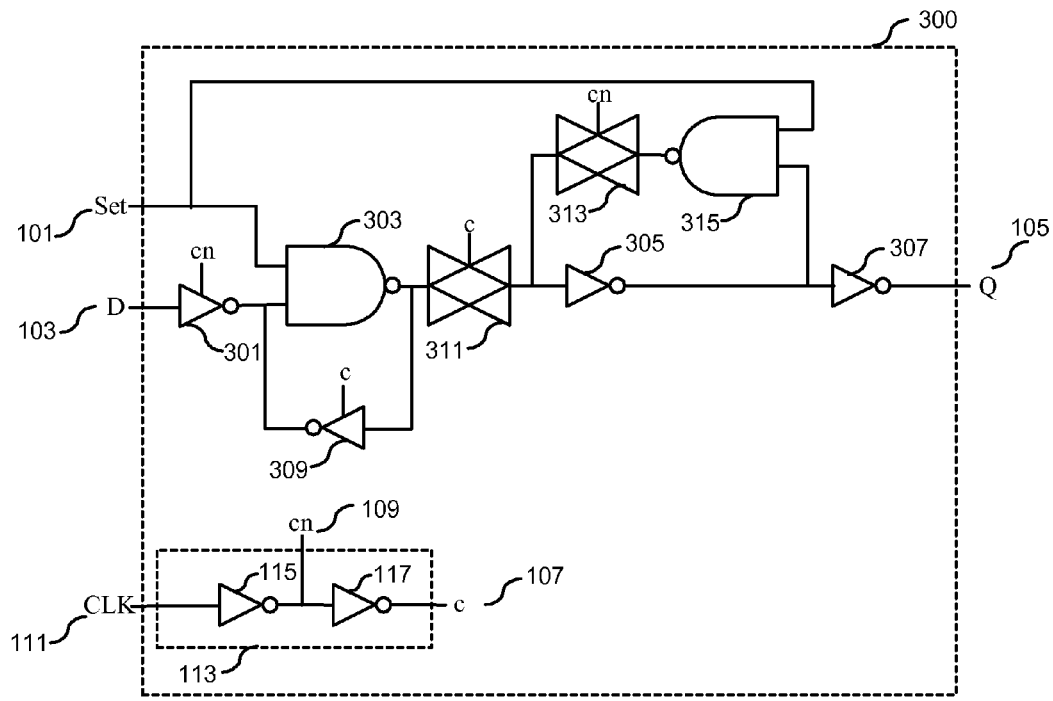
FIG. 3 is a schematic logic diagram of an exemplary known logic cell 300 that includes flip-flop logic circuitry, and clocking circuitry wherein clocking nodes of the flip-flop logic circuitry toggle in an undesirable manner.
Figure 6:
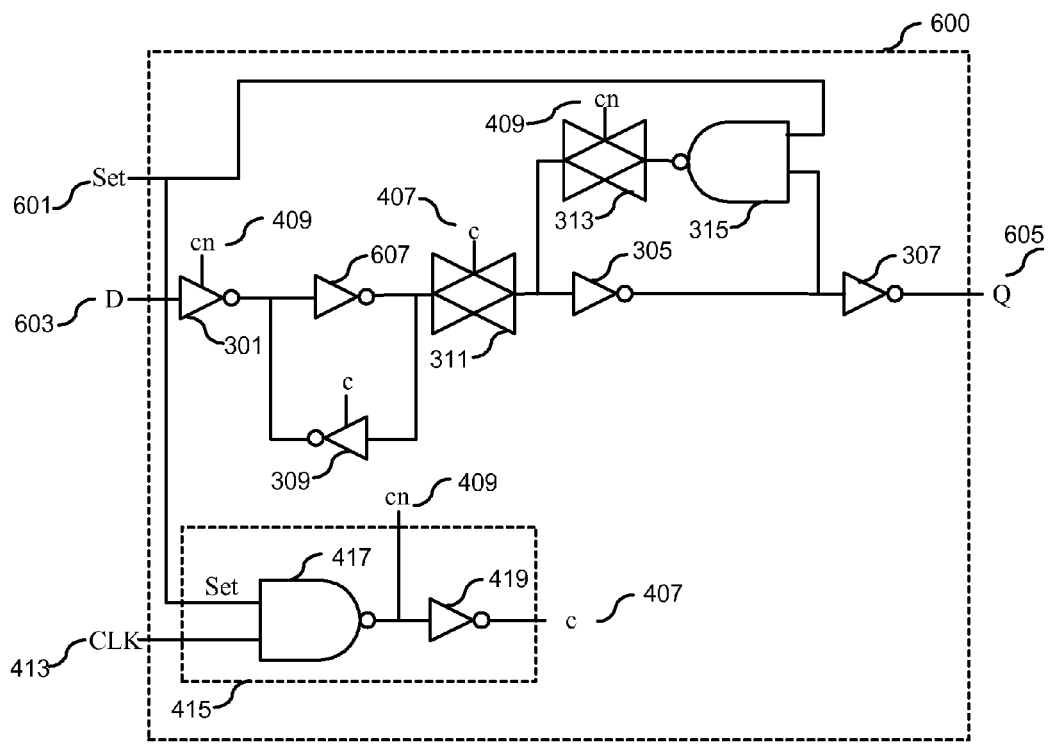
FIG. 6 is a schematic logic diagram of a logic cell in accordance with an embodiment that includes asynchronous set flip-flop logic circuitry and gated clock circuitry.

FIG. 6 is a schematic logic diagram of a logic cell 600 that has asynchronous set flip-flop logic circuitry and gated clock circuitry 415 in accordance with an exemplary embodiment. FIG. 6 may be viewed as modifying the known flip-flop circuitry of logic cell 300 that was described with respect to FIG. 3. Comparison of modified the flip-flop circuitry of logic cell 600 with the known flip-flop circuitry of logic cell 300 shows that the set input 601 in the flip-flop circuitry of logic cell 600 only feeds the NAND gate 315. The NAND gate 303 in the known flip-flop circuitry of logic cell 300 is replaced by an inverter 607 in the flip-flop circuitry of logic cell 600.

In FIG. 6, the gated clocking circuitry 415 is implemented in a manner identical to that shown in FIG. 5, that is, it receives the set 601 input along with the primary clock, CLK 413, and these inputs drive a NAND gate 417 to produce cn 409. Just as shown in FIG. 5, an inverter 419 in FIG. 6 provides the output c 407. Thus the set condition of the flip-flop circuitry of logic cell 600 follows similar principles to those described above with respect to the asynchronous set latch logic circuitry of logic cell 500. That is, in operation, when set 601 equals logical zero, the CLK 413 is gated, via NAND gate 417, such that cn equals logical one (i.e. cn=1) and c=0 (i.e the output of inverter 419, c 407, is logical zero).

Figure 7:
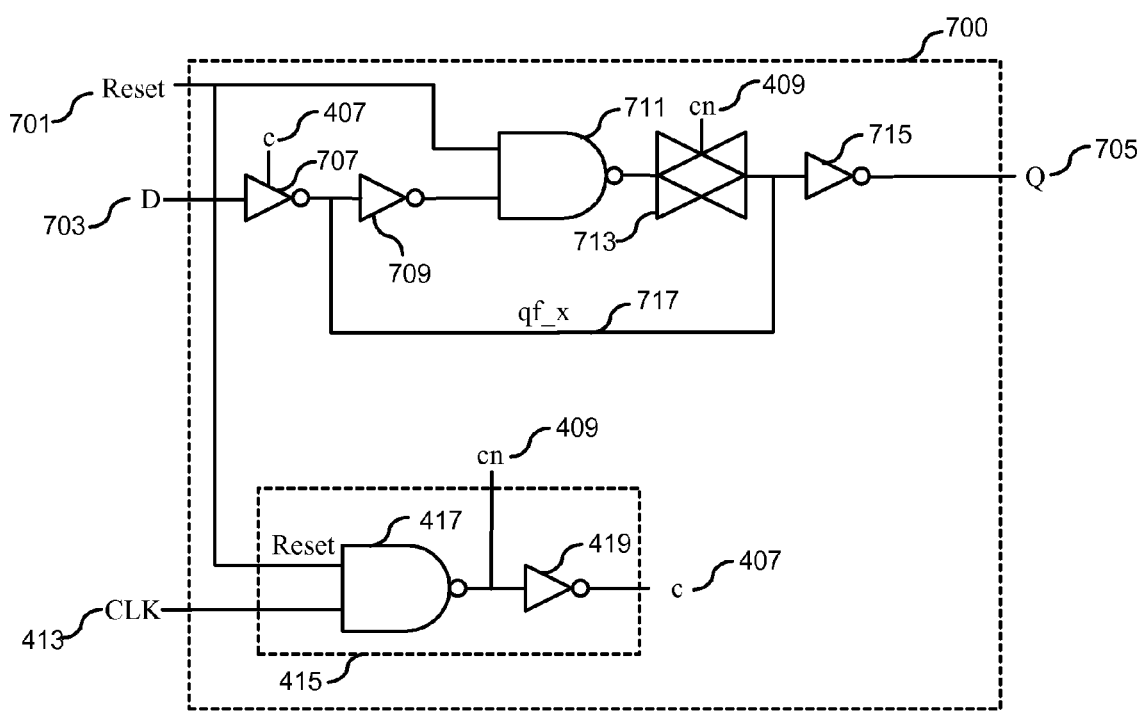
FIG. 7 is a schematic logic diagram of a logic cell in accordance with an embodiment that includes asynchronous reset latch logic circuitry, active HI, and gated clock circuitry.

FIG. 7 is a schematic logic diagram of another exemplary embodiment of a latch logic circuitry. FIG. 7 provides an asynchronous reset latch logic circuitry of logic cell 700, active HI, and having a gated clock circuitry in accordance with an embodiment. The asynchronous reset latch logic circuitry of logic cell 700, active HI, follows the principles set forth with respect to FIG. 5 for the asynchronous set, active HI, latch circuit of logic cell 500. In FIG. 7, reset 701 provides an input to the NAND gate 417 of the gated clocking circuitry 415 so that when reset=1, the CLK 413 is gated such that cn=1 and c=0. The feedback loop 717 ("qf_x") is closed, however the transmission gate 409 is transparent and therefore the output Q 705 is driven to logical "0."

Figure 8:
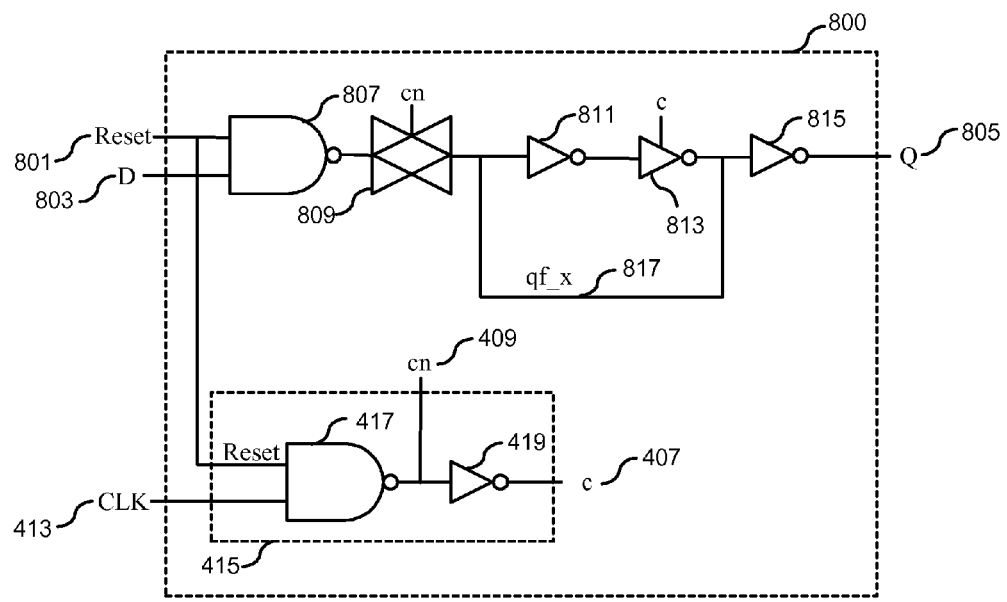
FIG. 8 is a schematic logic diagram of a logic cell in accordance with an embodiment that includes asynchronous reset latch logic circuitry, active LO, and gated clock circuitry.
Figure 9:
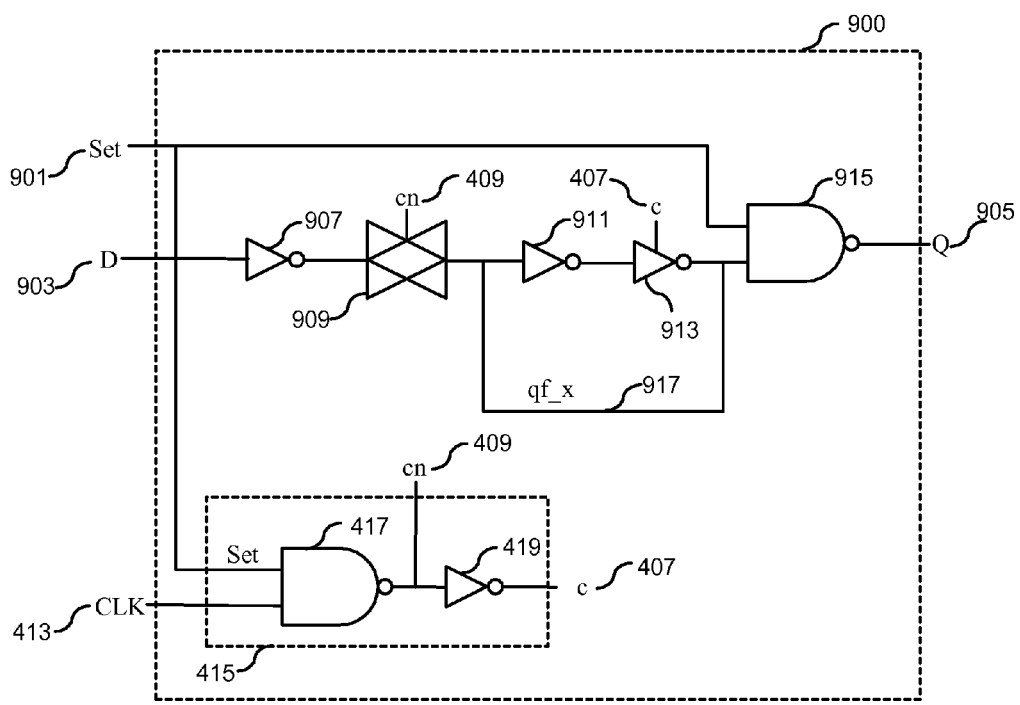
FIG. 9 is a schematic logic diagram of a logic cell in accordance with an embodiment that includes asynchronous set latch logic circuitry, active LO, and gated clock circuitry.

Additional exemplary embodiments are provided in FIG. 8 and FIG. 9 for active low ("active LO") logic circuitry. FIG. 8 is a schematic logic diagram for an asynchronous reset latch logic circuitry of logic cell 800, active LO, and having a gated clock circuitry 415 in accordance with an embodiment, and FIG. 9 is a schematic logic diagram for an asynchronous set latch logic circuitry of logic cell 900, active LO, and having a gated clock circuitry 415 in accordance with another embodiment.

In FIG. 8, when reset 801 equals logical zero, cn 409 is logical "1" and c 407 is logical "0." Therefore the latch logic circuitry of logic cell 800's feedback loop 817 is blocked and the latch logic circuitry remains constantly transparent. FIG. 9 follows similar principles of operations. FIG. 8, FIG. 9 and the other exemplary embodiments described above, all provide the various advantages that were discussed above with respect to FIG. 5.

Figure 10:
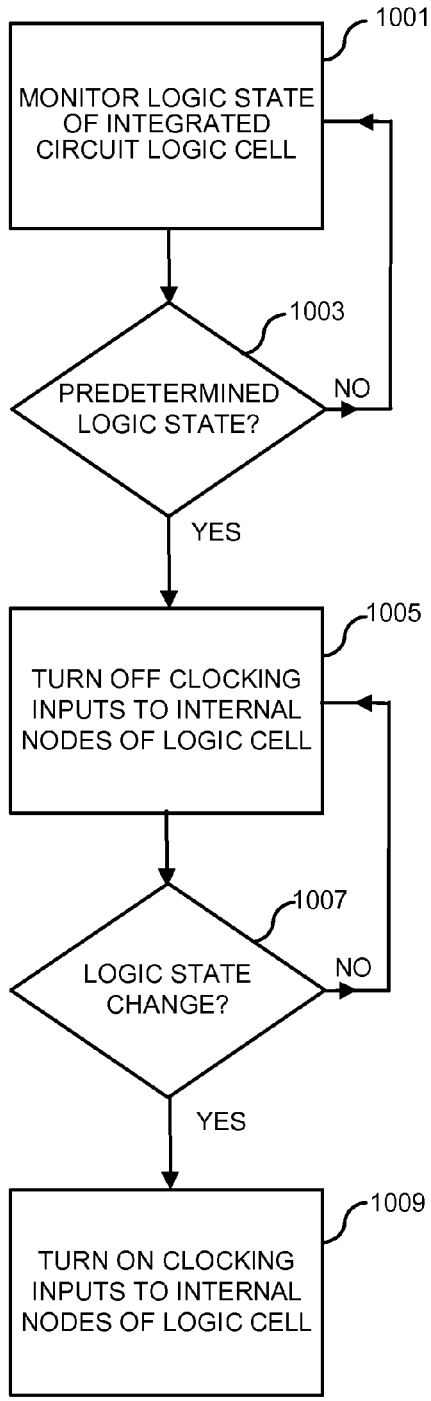
FIG. 10 is a flow chart illustrating operation of a logic cell in accordance with an embodiment.
Figure 11:
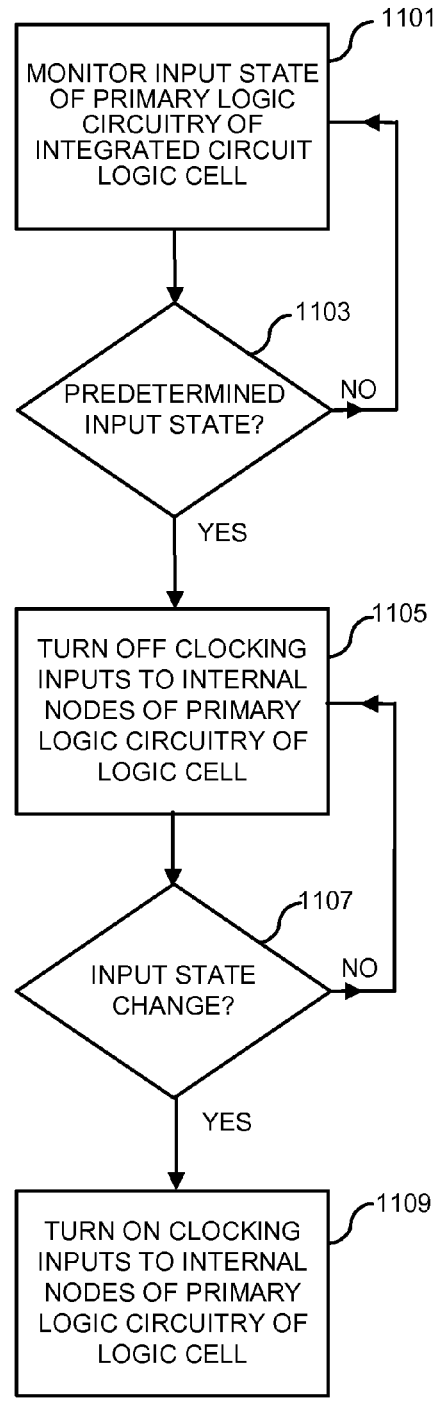
FIG. 11 is another flow chart illustrating operation of a logic cell in accordance with another embodiment.

FIG. 10 is a flow chart illustrating operation of a logic cell in accordance with an embodiment. In 1001, a logic state of an integrated circuit logic cell is monitored. If a predetermined logic state occurs in 1003, all clocking inputs to internal nodes of the logic cell are turned off in 1005. Otherwise, monitoring continues as in 1001. If a logic state change occurs in 1007 then the clocking inputs to internal nodes of the logic cell are turned on again in 1009. Otherwise, the logic state of the logic cell continues to be monitored as in 1007. FIG. 11 describes operation for monitoring a change in the input state of a logic cell. The internal clocking nodes of the logic cell are turned off or on in accordance with a predetermined input state at a monitored input of the logic cell's primary logic circuitry.

Therefore integrated circuit logic cells that have the ability to individually control and reduce internal power consumption due to spurious internal toggling has been disclosed and described. The disclosed logic cells may include logic circuitry with gated clocking circuitry. Methods of operation of logic cells have also been disclosed herein. Any other variations to any of the various disclosed embodiments that would be equivalent to the herein disclosed embodiments may occur to those of ordinary skill in the art and would remain in accordance with the scope of embodiments as defined herein by the following claims.

What is claimed is:

1. An integrated circuit logic cell comprising:
   a clock input operative to receive a clock input from a clock tree of said integrated circuit; and
   clocking circuitry, internal to said logic cell, operative to provide clock outputs based on the clock input, operative to identify a predetermined logic state of said logic cell wherein the clock input is not needed for operation of said logic cell in said predetermined logic state, and operative to hold a plurality of clock nodes, within said logic cell, in a logical off state during a toggling of the clock input in response to said predetermined logic state of said logic cell, thereby preventing said clock nodes from toggling during said predetermined logic state of said logic cell.

2. The integrated circuit logic cell of claim 1, comprising:
   primary logic circuitry, internal to said logic cell, operatively coupled to said clocking circuitry, wherein said clocking circuitry is operatively coupled to an input of said primary logic circuitry, and wherein said clocking circuitry provides clock outputs operatively coupled to said clock nodes wherein said clock nodes are within said primary logic circuitry, wherein said clocking circuitry is operative to control said clock outputs in response to said predetermined logic state.

3. The integrated circuit logic cell of claim 2, wherein said clocking circuitry is operative to control said clock outputs in response to a predetermined input state of said input of said primary logic circuitry.

4. The integrated circuit logic cell of claim 2, wherein said clocking circuitry comprises:
   a NAND gate having a first input operative to be coupled to a clock tree of said integrated circuit, and having a second input operatively coupled to said input of said primary logic circuitry; and
   an inverter operatively coupled to an output of said NAND gate.

5. The integrated circuit logic cell of claim 2, wherein said primary logic circuitry is an active high, asynchronous set latch logic circuitry.

6. The integrated circuit logic cell of claim 5, wherein said asynchronous set latch logic circuitry comprises:
   a first clocked inverter operatively coupled to a data input of said asynchronous set latch logic circuitry, and having a clock input operatively coupled to said clock output of said clocking circuitry;
   a NAND gate having a first input operatively coupled to a set input, wherein said set input is said input of said primary logic circuitry, and a second input operatively coupled to an output of said clocked inverter;
   a second clocked inverter having an input operatively coupled to an output of said NAND gate, an output providing a feedback operatively coupled to said second input of said NAND gate, and having a clock input operatively coupled to said clock output of said clocking circuitry; and
   an inverter having an input operatively coupled to an output of said second clocked inverter, and an output operatively coupled to an output of said asynchronous set latch logic circuitry.

7. The integrated circuit logic cell of claim 2, wherein said primary logic circuitry is a flip-flop logic circuitry.

8. The integrated circuit logic cell of claim 7, wherein said flip-flop logic circuitry comprises:
   a first clocked inverter operatively coupled to a data input of said flip-flop circuitry, and having a clock input operatively coupled to said clock output of said clocking circuitry;
   a first inverter having an input operatively coupled to an output of said first clocked inverter;
   a first transmission gate having an input operatively coupled to an output of said first inverter, and having a clock input operatively coupled to said clock output of said clocking circuitry;
   a second clocked inverter forming a feedback loop, having an input operatively coupled to said output of said first inverter, an output operatively coupled to said input of said first inverter, and having a clock input operatively coupled to said clock output of said clocking circuitry;

a second inverter having an input operatively coupled to an output of said first transmission gate;

a third inverter having an input operatively coupled to an output of said second inverter, and an output operatively coupled to an output of said flip-flop circuitry;

a NAND gate having a first input operatively coupled to a set input, wherein said set input is said input of said primary logic circuitry, and a second input operatively coupled to said output of said second inverter; and a second transmission gate having an input operatively coupled to an output of said NAND gate, an output providing a feedback operatively coupled to said input of said second inverter, and having a clock input operatively coupled to said clock output of said clocking circuitry.

9. The integrated circuit logic cell of claim 2, wherein said primary logic circuitry is an active high, asynchronous reset latch logic circuitry.

10. The integrated circuit logic cell of claim 9, wherein said asynchronous reset latch logic circuitry comprises:

a first clocked inverter operatively coupled to a data input of said asynchronous reset latch logic circuitry, and having a clock input operatively coupled to said clock output of said clocking circuitry;

a first inverter having an input operatively coupled to an output of said first clocked inverter;

a NAND gate having a first input operatively coupled to a reset input, wherein said reset input is said input of said primary logic circuitry, and a second input operatively coupled to an output of said first inverter;

a transmission gate having an input operatively coupled to an output of said NAND gate, an output providing a feedback operatively coupled to said input of said first inverter, and having a clock input operatively coupled to said clock output of said clocking circuitry; and a second inverter having an input operatively coupled to said output of said transmission gate, and an output operatively coupled to an output of said asynchronous reset latch logic circuitry.

11. The integrated circuit logic cell of claim 2, wherein said primary logic circuitry is an active low, asynchronous set latch logic circuitry.

12. The integrated circuit logic cell of claim 11, wherein said asynchronous set latch logic circuitry comprises:

a first inverter having an input operatively coupled to a data input of said asynchronous set latch logic circuitry;

a transmission gate having an input operatively coupled to an output of said first inverter, and having a clock input operatively coupled to said clock output of said clocking circuitry;

a second inverter having an input operatively coupled to an output of said transmission gate;

a clocked inverter having an input operatively coupled to an output of said second inverter and an output providing a feedback operatively coupled to said input of said second inverter, and having a clock input operatively coupled to said clock output of said clocking circuitry; and a NAND gate having a first input operatively coupled to a set input, wherein said set input is said input of said primary logic circuitry, and a second input operatively coupled to said output of said clocked inverter, and an output operatively coupled to an output of said asynchronous set latch logic circuitry.

13. The integrated circuit logic cell claim 2, wherein said primary logic circuitry is an active low, asynchronous reset latch logic circuitry.

14. The integrated circuit logic cell of claim 13, wherein said asynchronous reset latch logic circuitry comprises:

a NAND gate having a first input operatively coupled to a reset input, wherein said reset input is said input of said primary logic circuitry, and a second input operatively coupled to a data input of said asynchronous reset latch logic circuitry;

a transmission gate having an input operatively coupled to an output of said NAND gate, and having a clock input operatively coupled to said clock output of said clocking circuitry;

a first inverter having an input operatively coupled to an output of said transmission gate;

a clocked inverter having an input operatively coupled to an output of said first inverter and an output providing a feedback operatively coupled to said input of said first inverter, and having a clock input operatively coupled to said clock output of said clocking circuitry; and a second inverter having an input operatively coupled to an output of said clocked inverter, and an output operatively coupled to an output of said asynchronous reset latch logic circuitry.

15. An integrated circuit comprising the integrated circuit logic cell of claim 1.

16. The integrated circuit logic cell of claim 1, wherein said clocking circuitry is operative to identify said predetermined logic state based on a monitored input of said logic cell.

17. A method of operation in an integrated circuit logic cell, the method comprising:

monitoring, by clocking logic of said integrated circuit logic cell, a logic state of said integrated circuit logic cell; and turning off, by said clocking logic, clocked nodes within said integrated circuit logic cell in response to said logic cell entering a predetermined logic state, where the clocked nodes are derived from a toggling clock input, wherein said toggling clock input is not required for operation of said integrated circuit logic cell in said predetermined logic state.

18. The method of claim 17, wherein monitoring, by said clocking logic, a logic state of said integrated circuit logic cell, comprises monitoring a logic state of an input of said logic cell.

19. A non-transitory computer readable memory comprising:

executable instructions for execution by an integrated circuit production system, that when executed cause said integrated circuit production system to produce an integrated circuit comprising:

at least one integrated circuit logic cell comprising:

a clock input operative to receive a clock input from a clock tree of said integrated circuit; and clocking circuitry, internal to said logic cell, operative to provide clock outputs based on the clock input, operative to identify a predetermined logic state of said logic cell wherein the clock input is not needed for operation of said logic cell in said predetermined logic state, and operative to place a plurality of clock nodes, within said logic cell, in a logical off state during a toggling of the clock input in response to said predetermined logic state of said logic cell, thereby preventing said clock nodes from toggling during said predetermined logic state of said logic cell.

20. The non-transitory computer readable memory of claim 19, wherein said at least one logic cell further comprises:

primary logic circuitry, internal to said logic cell, operatively coupled to said clocking circuitry, wherein said clocking circuitry is operatively coupled to an input of said primary logic circuitry, and wherein said clocking circuitry provides clock outputs operatively coupled to said clock nodes wherein said clock nodes are within said primary logic circuitry, wherein said clocking circuitry is operative to control said clock outputs in response to said predetermined logic state.

21. The non-transitory computer readable memory of claim 20, wherein said clocking circuitry is operative to control said clock outputs in response to a predetermined input state of said input of said primary logic circuitry.

22. The non-transitory computer readable memory of claim 19, wherein said executable instructions are in an hardware description language (HDL) or RTL format.

23. The non-transitory computer readable memory of claim 19, wherein said clocking circuitry is operative to identify said predetermined logic state based on a monitored input of said logic cell.

* * * * *